United States Patent
Dinsmore et al.

(10) Patent No.: US 9,269,562 B2
(45) Date of Patent: Feb. 23, 2016

(54) IN SITU CHAMBER CLEAN WITH INERT HYDROGEN HELIUM MIXTURE DURING WAFER PROCESS

(71) Applicant: Applied Materials, Inc., Santa Clara, CA (US)

(72) Inventors: Robert Dinsmore, Sunnyvale, CA (US); John C. Forster, Mountain View, CA (US); Song-Moon Suh, San Jose, CA (US); Cheng-Hsiung Tsai, Cupertino, CA (US); Glen T. Mori, Gilroy, CA (US)

(73) Assignee: APPLIED MATERIALS, INC., Houston, TX (US)

( * ) Notice: Subject to any disclaimer, the term of this patent is extended or adjusted under 35 U.S.C. 154(b) by 500 days.

(21) Appl. No.: 13/743,646

(22) Filed: Jan. 17, 2013

(65) Prior Publication Data
US 2014/0196746 A1 Jul. 17, 2014

(51) Int. Cl.
*H01L 21/3065* (2006.01)
*H01L 21/02* (2006.01)
*H01L 23/00* (2006.01)

(52) U.S. Cl.
CPC ..... *H01L 21/02063* (2013.01); *H01L 21/02068* (2013.01); *H01L 24/03* (2013.01); *H01L 24/05* (2013.01); *H01L 2224/0381* (2013.01)

(58) Field of Classification Search
None
See application file for complete search history.

(56) References Cited

U.S. PATENT DOCUMENTS

| | | | |
|---|---|---|---|
| 6,057,694 A * | 5/2000 | Matsudo | 324/754.11 |
| 6,313,042 B1 | 11/2001 | Cohen et al. | |
| 6,537,876 B2 | 3/2003 | Chung et al. | |
| 7,053,002 B2 | 5/2006 | Cohen et al. | |
| 2002/0144655 A1* | 10/2002 | Chiang et al. | 118/715 |
| 2004/0014324 A1* | 1/2004 | Hamada | 438/707 |
| 2012/0094250 A1 | 4/2012 | Lloyd et al. | |
| 2012/0225558 A1 | 9/2012 | Chang et al. | |

FOREIGN PATENT DOCUMENTS

KR 10-2011-0096499 A 8/2011

OTHER PUBLICATIONS

International Search Report and Written Opinion dated Mar. 25, 2014 for Application No. PCT/US2013/073624.

* cited by examiner

*Primary Examiner* — Michael Kornakov
*Assistant Examiner* — Ryan Coleman
(74) *Attorney, Agent, or Firm* — Patterson & Sheridan, LLP

(57) ABSTRACT

Embodiments of the present invention generally relate to a method for cleaning a processing chamber during substrate processing. During a first substrate processing step, a plasma is formed from a gas mixture of argon, helium, and hydrogen in the processing chamber. In a second substrate processing step, an argon plasma is formed in the processing chamber.

19 Claims, 3 Drawing Sheets

IN SITU CHAMBER CLEAN WITH INERT HYDROGEN HELIUM MIXTURE DURING WAFER PROCESS

BACKGROUND OF THE INVENTION

1. Field of the Invention

Embodiments of the present invention generally relate to a method for reducing particle deposition and cleaning a chamber while processing a substrate. More specifically, embodiments of the present invention relate to an in situ chamber clean with an inert hydrogen helium mixture during wafer processing.

2. Description of the Related Art

During chip packaging, metal layers are used for connecting solder material to bond pads that are electrically connected to semiconductor devices. Generally, incoming wafers for under-bump metallization (UBM) processes consist of metal pads embedded in a polymer passivation layer, such as a polyimide layer. The metal pads, such as aluminum pads, must be cleaned prior to UBM to remove any native oxide, such as aluminum oxide, from the surface of the metal pads.

FIG. 1A is a prior art schematic view of a packaging preclean process chamber 100. Currently, etching processes are used to remove the native oxide 114 from the surface of the aluminum pads 112. Etching processes generally utilize a halogen plasma 106, such as an argon plasma, to bombard the surface of a substrate 110 with ions to sputter (remove) undesired material present on the surface of the substrate 110. The etching removes native oxide 114, which generally reduces electrical conductivity, from the surface of the aluminum pads 112 but also sputters 118 the polymer layer 116 which re-deposits on interior surfaces 104 of the semiconductor processing chamber kit 102. The re-deposited polymer 108 on the interior surfaces 104 increases the presence of particles in the chamber which may lead to undesirable contamination of the substrate 110 and increase the defectivity of the packaging preclean process.

Generally, the polymer sputtered on the interior surfaces of the chamber kit is pasted over with an aluminum paste to reduce the presence of particle contaminants in the chamber. However, aluminum pasting in the chamber is time consuming and decreases throughput because a substrate is generally not present in the chamber during the pasting process. Therefore, it is desirable to reduce the amount of polymer re-deposited on the interior surfaces of the chamber. Providing oxygen plasma to the chamber to perform an ashing process is effective at removing the polymer from the interior surfaces of the chamber but the presence of oxygen in the chamber will cause oxidation of the metal pad, creating undesirable native oxide thereon as previously discussed. Therefore, a substrate cannot be processed while performing an ashing process, which reduces throughput.

Accordingly, what is needed in the art is a method of reducing polymer deposits on the interior surfaces of a processing chamber that does not promote the formation of native oxide and reduces the frequency of aluminum pasting to cover the re-deposited polymer on the interior surfaces of the chamber.

SUMMARY OF THE INVENTION

Embodiments of the present invention generally relate to a method for cleaning a substrate in a processing chamber. During a first substrate processing step, a plasma is formed from a gas mixture of argon, helium, and hydrogen in the processing chamber. In a second substrate processing step, an argon plasma is formed in the processing chamber. The combination of the first processing step and the second processing step increases throughput by eliminating the need for removing each substrate during cleaning.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a method for cleaning a processing chamber during substrate processing. During a first substrate processing step, a plasma is formed from a gas mixture of argon, helium, and hydrogen in the processing chamber. In a second substrate processing step, an argon plasma is formed in the processing chamber.

Figure 1A:
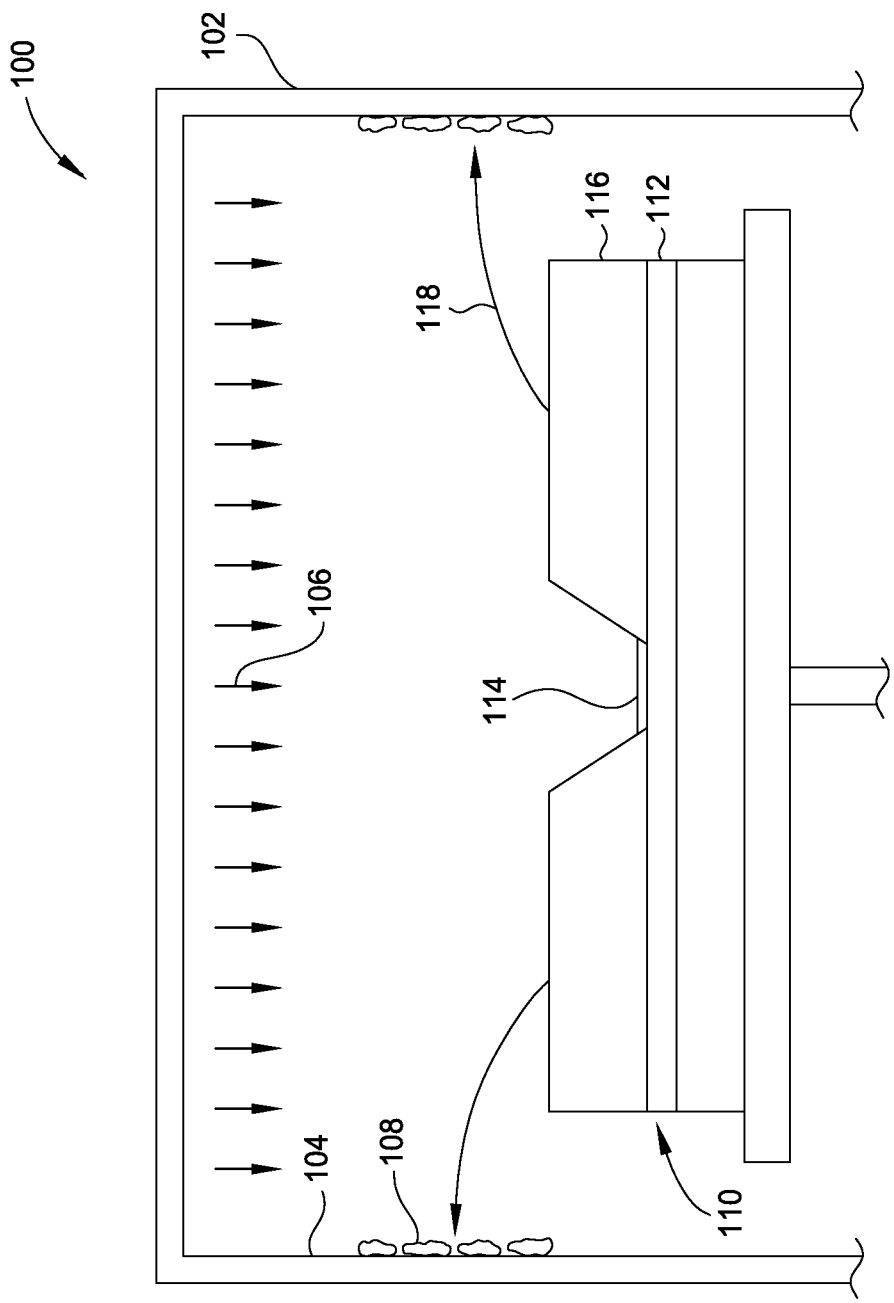
FIG. 1A is a prior art schematic view of a packaging preclean process.
Figure 1B:
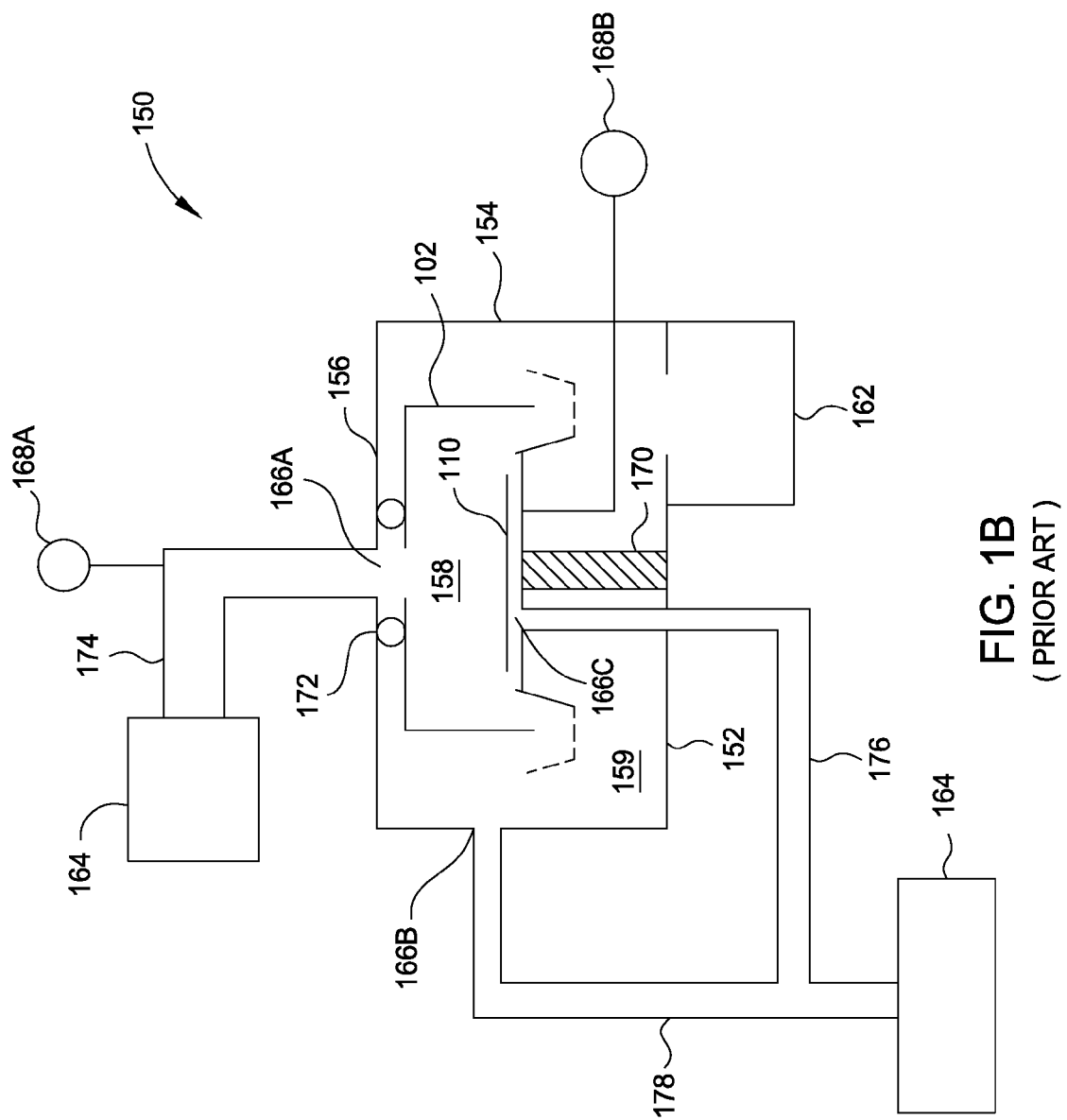
FIG. 1B is a prior art schematic view of a general processing chamber structure and plumbing architecture in which the invention may be practiced.
Figure 2:
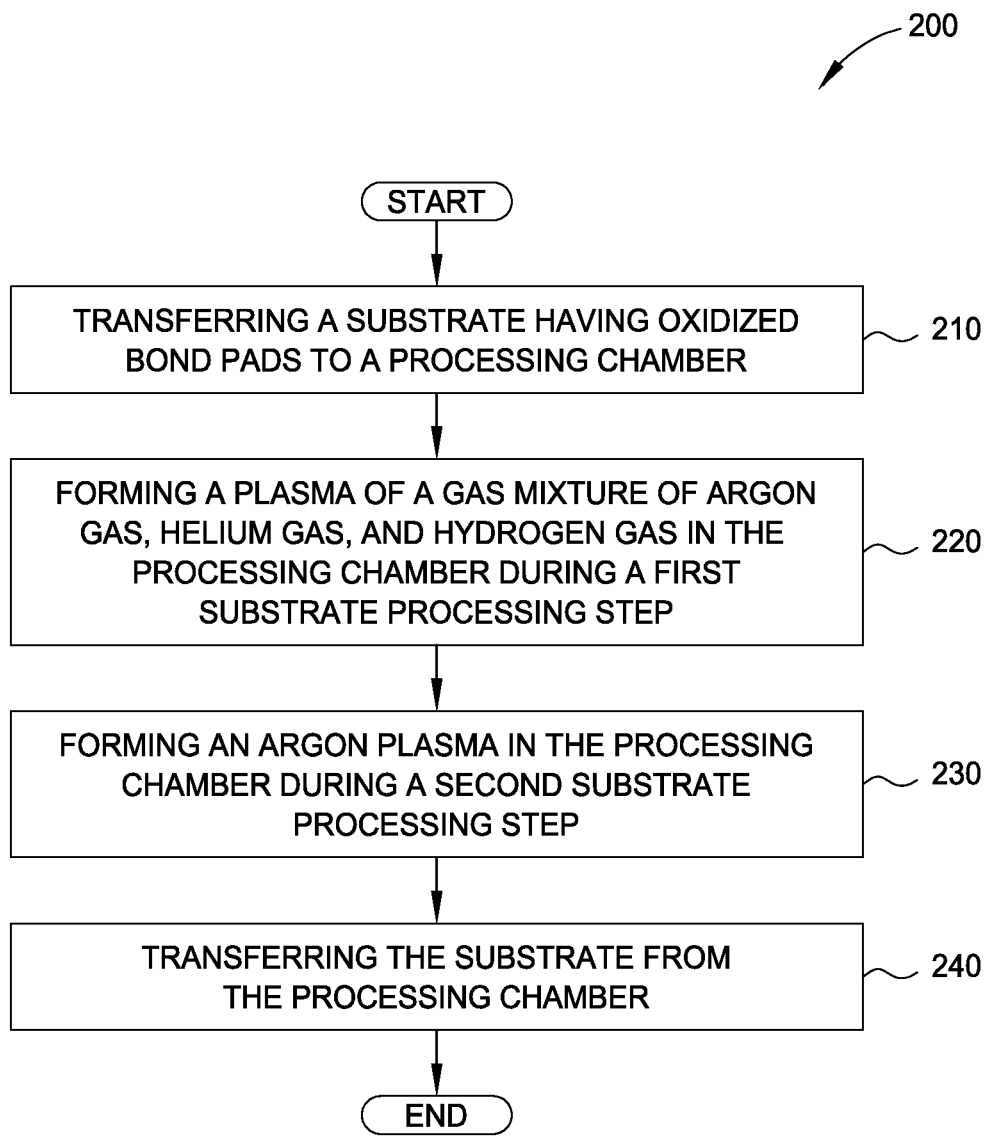
FIG. 2 is a flow chart reflecting a method for cleaning a processing chamber during substrate processing according to certain embodiments of the present invention.

FIG. 2 is a flow diagram of method steps for an in situ chamber clean with an inert hydrogen helium mixture during wafer processing. Although the method steps are described in conjunction with general hardware embodiments, persons skilled in the art will understand that any system configured to perform the method steps, in any order, falls within the scope of the present invention. The method of FIG. 2 will be discussed with reference to the 300 mm substrate processing chamber and plumbing structure provided in FIG. 1B.

Generally, a packaging preclean process may be performed in a semiconductor processing chamber. It is contemplated that the method for cleaning a processing chamber may be performed in various chambers which are available from Applied Materials, Inc. Santa Clara, Calif. A preferred chamber is the Charger™ preclean chamber. It is noted that chambers available from other manufacturers may also be utilized to practice the present invention.

Generally, a semiconductor processing chamber 150 which may practice the invention includes a chamber body which includes a base 152, sidewalls 154, and a lid 156 which are made from a metal such as stainless steel or aluminum, or other similar materials. The chamber base 152, sidewalls 154, and lid 156 define a chamber volume 159 within which a process kit 102 is disposed. The volume within the process kit 102 defines an interior processing region 158 configured to process a substrate 110. The substrate 110 to be processed is not limited to any particular size or shape. The substrate 110 may be a round wafer or may be polygonal, square, rectangular, curved, or any other non-circular workpiece. A means for controlling gas pressure inside the chamber 150, such as a throttle valve (not shown) and a turbo pump 162, may also be provided external to the chamber 150.

Generally, a gas panel 164 or similar device is configured to deliver gases to the chamber 150 through gas inlets 166A-C.

The gas inlets 166A-C may comprise a single inlet or multiple inlets disposed in different areas of the chamber 150. In one embodiment, a gas supplied from the gas panel 164 and delivered through gas inlet 166A passes through a gas distribution plate (not shown) coupled to the chamber lid 156 into the interior processing region 158. An air-tight seal 172 may be provided in this embodiment to prevent the leakage of the gas into the chamber volume away from the interior processing region 158. The gas panel 164 may supply gases which are metered by mass flow controllers or the like. Exemplary gases that may be delivered to the chamber include halogen gases, inert gases such as helium and argon, and hydrogen gas, and combinations and mixtures thereof. The distribution plate generally has a plurality of apertures formed therethrough which allow the gases to flow into the interior processing region 158. The apertures may have different sizes, dimensions, and distributions across the gas distribution plate so as to deliver gases with different flow rates and/or flow volumes in the interior processing region 158. In another embodiment, multiple gas inlets 166A-C may be utilized to provide the gases to multiple locations within the chamber 150.

An RF power source 168A may be coupled to the gas distribution plate or gas feed tube 174 to supply RF power through a matching network (not shown) configured to facilitate generation of a plasma in the interior processing region 158. In another embodiment, an RF power source 168B may be additionally coupled to a substrate support 170 adapted to support the substrate 110 during processing. Optionally, a remote plasma system (not shown) may be used to create a plasma in the interior processing region 158 of the chamber 150. The RF power is generally provided to the chamber 150 at a frequency between about 13.56 MHz and about 60 MHz, but may be configured to deliver other frequencies dependent upon the type of substrate processing performed in the chamber. In one embodiment, multiple frequencies may be provided concurrently to the chamber 150 at one or multiple locations from the RF power sources 168A-B. In a preferred embodiment, at least one of the RF power sources 168B is coupled to the substrate support 170.

The substrate support 170 is disposed in the chamber 150 through the base 152 of the chamber 150. The substrate support 170 may be fabricated from aluminum, ceramic, or other suitable materials. The substrate support 170 is coupled to an actuator (not shown) and may be moveable in a vertical orientation within the chamber 150 between a first position configured to receive a wafer and a second position configured to provide the substrate in a processing position for processing in the interior processing region 158. The substrate support 170 may also include a heating element (not shown) configured to heat a substrate 110 disposed thereon.

A controller, including a central processing unit (CPU), a memory, and support circuits for the CPU, may be coupled to the various components of the substrate processing chamber to facilitate control of the chamber cleaning process. To facilitate control of the chamber as described above, the CPU may be one of any form of general purpose computer processor that can be used in an industrial setting for controlling various chambers and subprocessors. The memory, or computer readable medium, is coupled to the CPU and may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits generally include a cache, power supplies, clock circuits, input/output circuitry, subsystems, and the like. A process for cleaning a processing chamber, such as described herein, is generally stored in the memory as a software routine. The software routine may also be stored and/or executed by a second CPU that is remotely located from the hardware being controlled by the CPU.

Generally, a substrate 110 is provided to the processing chamber 150 for a packaging preclean process. In one embodiment, an aluminum layer 112 is disposed on the substrate 110 and encapsulated with a thick polyimide passivation layer 116. Portions of the aluminum layer are exposed, thus providing aluminum contact pads. Native oxide 114 is typically present on the surface of the aluminum contact pads and must be removed prior to subsequent packaging processes, such as metallization. The native oxide 114 is generally a thin film on the surface of the aluminum contact pads and results from the aluminum's exposure to oxygen or other oxidizing environments in previous processing or transfer processes.

The method for cleaning a processing chamber begins by transferring a substrate 110 having oxidized bond pads, such as aluminum contact pads, to a processing chamber 150 at step 210. The substrate 110 may be transferred to the processing chamber 150 by any conventional means. Next, step 220 is performed by forming a plasma of a gas mixture of argon gas, helium gas, and hydrogen gas in the interior processing region 158 of the processing chamber 150. In one embodiment, the argon, helium, and hydrogen may be mixed prior being delivered to the interior processing region 158. In this embodiment, a single gas inlet, such as gas inlet 166A, provides the mixture of gases to the interior processing region 158 of the chamber. In another embodiment, the argon may be delivered to the interior processing region 158 separately from the helium or hydrogen. In this embodiment, multiple inlets 166A-C may be configured to provide the gases at different locations within the chamber 150.

In one embodiment for 300 mm substrates, the argon provided to the chamber 150 is pure argon gas. The argon gas is provided to the interior processing region 158 between about 300 standard cubic centimeters per minute (sccm) to about 400 sccm during ignition of the argon into a plasma. During processing with argon plasma, the argon gas is provided to the interior processing region 158 between about 25 sccm and about 150 sccm, such as about 65 sccm. The helium and hydrogen gases are provided to the chamber volume 159 or interior processing region 158 between about a 95:5 helium:hydrogen ratio and about a 5:95 helium:hydrogen ratio. The helium and hydrogen gasses are provided to the chamber volume 159 or interior processing region 158 between about 18 sccm and about 200 sccm, such as about 100 sccm during both the ignition into plasma and processing stages. In this embodiment, the helium is an inert carrier gas and the hydrogen is a reactive gas.

Once the gas mixture is provided to the interior processing region 158 of the chamber, RF current is supplied to chamber structures, such as a distribution plate, gas tube 174, or substrate support 170 to create a plasma of the gas mixture. In one embodiment, the RF current may be provided to the gas mixture at a frequency of about 13.56 MHz and a power between about 0 W to about 900 W, such as about 400 W. In another embodiment, the RF current may be provided to the gas mixture at a frequency of about 60 MHz and a power between about 200 W to about 1400 W, such as about 800 W. In either embodiment, the pressure of the interior processing region 158 is maintained between about 1 mT and about 100 mT, such as about between about 7 mT and about 25 mT. Generally, the pressure within the interior processing region 158 is three times greater that the pressure within the chamber volume 159. The pressure differential between the interior processing region 158 and the chamber volume 159 is maintained by controlling the flow of gases provided to the chamber and gases exhausted from the chamber by the pump 162. The argon in the gas mixture plasma etches the surface of the substrate 110 by removing the native oxide layer 114 present on the aluminum contact pads. The argon ions bombard the native oxide layer 114 and sputter away native oxide from the surface of the aluminum contact pads. The argon in the gas mixture plasma also removes polyimide 116 from the surface of the substrate 110 by sputtering. When the polyimide 116 is removed from the surface of the substrate 110, the sputtered polyimide is generally a particulate in the interior processing region 158 and eventually deposits on interior surfaces of the process kit 102.

The hydrogen plasma reacts with the sputtered polyimide to form a hydrocarbon gas which may then be evacuated from the chamber 150. In a preferred embodiment, the hydrogen reacts with the sputtered polyimide before the polyimide deposits on the interior surfaces of the process kit 102. In another embodiment, the hydrogen reacts with polyimide previously deposited on the interior surfaces of the process kit 102 to reduce the thickness of a sputtered polyimide layer on the interior surfaces of the process kit 102. It is contemplated that the hydrogen plasma should be provided to the chamber volume 159 and interior processing region 158 in a manner that allows the hydrogen plasma to contact the interior surfaces of the process kit 102 in their entirety. Such a manner may be controlled by the apertures in the distribution plate, location of gas inlets 166A-C, and flow controllers as described above.

In one embodiment, helium reduces the temperature at which the substrate 110 is maintained. In one embodiment, the substrate 110 temperature may be reduced from about 120° C. to about −10° C. The reduction in temperature improves removal of the native oxide layer 114 from the surface of the aluminum contact pads. The reduction in temperature also reduces the rate at which the aluminum contacts pads may oxidize. In one embodiment, the helium gas and hydrogen gas mixture may be provided to the chamber at about 18 sccm during chucking of the substrate 110 and about 100 sccm during processing of the substrate 100. In certain embodiments, the helium may be provided through any one of gas tubes 174, 176, and 178 or may be provided through a combination of the gas tubes 174, 176, and 178. In a preferred embodiment, the helium gas is provided from the same gas tube through which the hydrogen is provided.

In one embodiment, the gas mixture plasma may etch the substrate 110 and clean the process kit 102 for about 1 second to about 60 seconds, such as about 30 seconds. In this embodiment, the etching process removes approximately 67% of the native oxide layer 114 from the surface of the aluminum contact pads. Thus, some native oxide may remain on the surface of the aluminum contact pads upon completion of step 220. In another embodiment, etching with the gas mixture may proceed for about 30 seconds to about 60 seconds, such as about 45 seconds. In this embodiment, the etching process will have removed substantially all of the native oxide layer 114 from the surface of the aluminum contact pads. The gas mixture comprising a reactive hydrogen gas has been shown to provide an approximately 11-70% reduction in the thickness of the polyimide deposited on the interior surface of the process kit 102. The reduction in thickness of the polyimide reduces the frequency at which the process kit 102 must be cleaned by a chamber clean process, aluminum pasting, or ashing, which provides for increased throughput.

In another embodiment, argon may be provided to the interior processing region 158 with hydrogen. In this embodiment, helium is not present in the chamber 150. The argon and hydrogen are provided between about a 95:5 argon:hydrogen ratio and about a 5:95 argon:hydrogen ratio. RF power is supplied to the chamber 150 to create a plasma of the argon and hydrogen mixture. The argon plasma etches the surface of the substrate 110 as described above and the hydrogen plasma reacts with sputtered polyimide to form a hydrocarbon gas. Generally, the mixture excluding helium may be performed in substantially the same manner as the mixture containing helium.

At step 230, an argon plasma is formed in the interior processing region 158. Similar to the gas mixture described above, argon is provided to the interior processing region 158 and RF current is provided to create an argon plasma. In one embodiment, the RF current may be provided to the argon gas at frequency of about 13.56 MHz and a power between about 0 W to about 900 W, such as about 300 W. In another embodiment, the RF current may be provided to the argon gas at a frequency of about 60 MHz and a power between about 200 W to about 1400 W, such as about 800 W. At step 230, the argon gas is provided to the interior processing region 158 for plasma ignition between about 300 sccm and about 400 sccm, such as about 300 sccm. During processing, the argon gas is provided to the interior processing region 158 between about 25 sccm and about 150 sccm, such as about 65 sccm. During step 230, the interior processing region 158 is maintained at a pressure between about 1 mT and about 100 mT, such as between about 7 mT and about 10 mT. In this step 230 subsequent to step 220, no helium or hydrogen is provided. The argon plasma etches the surface of the substrate 110 to remove the remaining native oxide from the surface of the aluminum contact pads, such as native oxide not removed during step 220. In one embodiment, etching with argon gas proceeds for about 10 seconds to about 20 seconds. It is believed that the pure argon plasma creates a cleaner aluminum surface than etching with the plasma gas mixture (ie. argon/helium/hydrogen). Therefore, the argon only plasma "clean-back" process of step 230 provides a cleanliness of the aluminum contact pad acceptable for subsequent packaging applications.

In another embodiment, steps 220 and 230 may be repeated in an alternating manner to achieve a desirable combination of native oxide removal and reduction of polyimide particulate matter in the interior processing region 158 and as deposited on the interior surfaces of the process kit 102. It is contemplated that the chamber 150 may be evacuated after step 220 and 230 or after performing the sequence of steps 220 and 230 to reduce the presence of undesirable particulate matter or hydrocarbon gases present in the interior processing region 158 of the chamber to prevent contamination of the substrate 110.

The reduction in polyimide deposited on the interior surface of the process kit 102 due to the reaction with the hydrogen plasma reduces the frequency with which the process kit 102 must be subjected to a clean process or replaced with a new process kit. With fewer clean processes performed in the chamber 150, throughput may be increased.

Finally, at step 240, the substrate is transferred from the processing chamber 150. The substrate 110 may be transferred from the processing chamber 150 by any known conventional means and steps 210-240 may be repeated with a new substrate.

While the foregoing is directed to embodiments of the present invention, other and further embodiments of the invention may be devised without departing from the basic scope thereof, and the scope thereof is determined by the claims that follow.

The invention claimed is:

1. A method for cleaning a processing chamber, comprising:
    forming a plasma of a gas mixture of argon gas, helium gas, and hydrogen gas in the processing chamber during a first substrate processing step, wherein a temperature of a substrate is less than about 120° C. during the first substrate processing step; and
    forming a plasma of a gas consisting of argon in the processing chamber during a second substrate processing step, wherein the first substrate processing step removes a native oxide from an aluminum contact pad and a polyimide compound from a surface of the substrate.

2. The method of claim 1, wherein the first substrate processing step is performed for about 1 second to about 60 seconds.

3. The method of claim 1, wherein a lesser amount of the polyimide compound is deposited on an interior surface of the chamber during the first substrate processing step as compared to the second substrate processing step.

4. The method of claim 1, wherein the hydrogen gas reacts with the polyimide compound to form a hydrocarbon compound.

5. The method of 4, wherein the polyimide compound removed from the surface of the substrate reacts with the hydrogen gas before the polyimide compound can be deposited on an interior surface of the chamber.

6. The method of 4, wherein the hydrogen gas reacts with a polyimide compound previously deposited on an interior surface of the chamber.

7. The method of 4, wherein the hydrocarbon compound is subsequently evacuated from the chamber.

8. The method of claim 1, wherein a portion of the gas mixture comprising helium and hydrogen provides a helium to hydrogen ratio between about 95:5 and about 5:95.

9. The method of claim 1, wherein the gas mixture plasma and the plasma of a gas consisting of argon comprise an RF plasma.

10. The method of claim 1, wherein the second substrate processing step is performed for about 10 seconds to about 20 seconds.

11. The method of claim 1, wherein the second substrate processing step cleans an aluminum contact pad on a surface of the substrate for a subsequent packaging process.

12. A method for cleaning a processing chamber, comprising:
    generating a plasma of a mixture of argon gas, helium gas, and hydrogen gas in the processing chamber during a first substrate processing step, wherein a temperature of a substrate is less than about 120° C. during the first substrate processing step, and wherein the first substrate processing step removes a native oxide from an aluminum contact pad and a polyimide compound from a surface of the substrate;
    evacuating an interior processing region of the chamber; and
    generating a plasma of a gas consisting of argon in the processing chamber during a second substrate process step.

13. The method of claim 12, wherein the first substrate processing step is performed for about 1 second to about 60 seconds.

14. The method of claim 12, wherein a portion of the gas mixture comprising helium and hydrogen provides a helium to hydrogen ratio between about 95:5 and about 5:95.

15. The method of claim 12, wherein the gas mixture plasma and the plasma of a gas consisting of argon comprise an RF plasma.

16. The method of claim 12, wherein the second substrate processing step is performed for about 10 seconds to about 20 seconds.

17. A method for cleaning a processing chamber, comprising:
    generating a plasma of a gas mixture of argon gas, helium gas, and hydrogen gas in the processing chamber during a first substrate processing step; and
    generating a plasma of a gas consisting of argon in the processing chamber during a second substrate processing step, wherein the first substrate processing step removes a native oxide from an aluminum contact pad and a polyimide compound from a surface of the substrate.

18. The method of claim 17, wherein a portion of the gas mixture comprising helium and hydrogen provides a helium to hydrogen ratio between about 95:5 and about 5:95.

19. The method of claim 17, wherein the gas mixture plasma and the plasma of a gas consisting of argon comprise an RF plasma.

* * * * *

UNITED STATES PATENT AND TRADEMARK OFFICE
CERTIFICATE OF CORRECTION

PATENT NO. : 9,269,562 B2
APPLICATION NO. : 13/743646
DATED : February 23, 2016
INVENTOR(S) : Dinsmore et al.

Page 1 of 1

It is certified that error appears in the above-identified patent and that said Letters Patent is hereby corrected as shown below:

In the Claims:

Column 8, Claim 12, Line 13, please delete "process" and insert --processing-- therefor.

Signed and Sealed this
Fourteenth Day of June, 2016

Michelle K. Lee
*Director of the United States Patent and Trademark Office*